United States Patent [19]

Koizumi et al.

[11] Patent Number: 5,410,172
[45] Date of Patent: Apr. 25, 1995

[54] THIN FILM TRANSISTOR AND PREPARATION THEREOF

[75] Inventors: Toru Koizumi, Machida; Jun Nakayama, Atsugi; Hidemasa Mizutani, Sagamihara, all of Japan

[73] Assignee: Canon Kabushiki Kaisha, Tokyo, Japan

[21] Appl. No.: 996,887

[22] Filed: Dec. 23, 1992

Related U.S. Application Data

[63] Continuation of Ser. No. 845,360, Mar. 5, 1992, abandoned, which is a continuation of Ser. No. 559,327, Jul. 30, 1990, abandoned.

[30] Foreign Application Priority Data

| Jul. 31, 1989 | [JP] | Japan | 1-198263 |
| Aug. 25, 1989 | [JP] | Japan | 1-217542 |
| Aug. 25, 1989 | [JP] | Japan | 1-217543 |

[51] Int. Cl.⁶ .................................... H01L 29/78
[52] U.S. Cl. ............................. 257/347; 257/368; 257/408; 257/653; 257/72
[58] Field of Search .................... 357/23.7, 4, 59, 30, 357/23.1, 23.3, 20, 91, 347, 350, 368, 401, 408, 431, 653, 66, 72

[56] References Cited

U.S. PATENT DOCUMENTS

| 4,394,182 | 7/1983 | Maddox | 148/1.5 |
| 4,778,258 | 10/1988 | Parks et al. | 350/336 |
| 4,868,140 | 9/1989 | Yonehara | 357/4 |
| 4,954,855 | 9/1990 | Mimura et al. | 257/412 |

FOREIGN PATENT DOCUMENTS

| 0002107 | 5/1979 | European Pat. Off. | H01L 21/18 |
| 0234152 | 9/1987 | European Pat. Off. | H01L 20/08 |
| 2948120 | 6/1980 | Germany | H01L 29/78 |
| 3237539 | 7/1983 | Germany | H01L 21/32 |
| 58-52881 | 3/1983 | Japan | H01L 29/80 |

OTHER PUBLICATIONS

*Applied Physics A. Solids and Surfaces,* vol. A34, No. 3, Jul. 1984, pp. 175–178, Heidelberg, DE, Snell, A., et al., "A New Vertically Integrated Amorphous Silicon Addressable Image Sensor".

*Primary Examiner*—Mark V. Prenty
*Attorney, Agent, or Firm*—Fitzpatrick, Cella Harper & Scinto

[57] ABSTRACT

A thin film transistor is provided with a semiconductor layer disposed on an insulating layer region having a channel region and a plurality of main electrode regions having an impurity concentration higher than an impurity concentration of the channel region. A second insulating layer region is disposed on the semiconductor region layer, and a control electrode is disposed on the second insulating layer. An interface is defined between at least one of the main electrode regions and the channel regions through a thickness of the semiconductor layer becoming increasing remote from its side of the control electrode in the direction from the second insulating layer region toward the first insulating layer region. An original point is defined as a position of the interface immediately beneath the insulating layer region. When a layer thickness of the semiconductor region is defined as $T_{SOI}$ and a maximum distance of the semiconductor layer region in the direction normal to a layer thickness is defined as $L_{UP}$ a value, the ratio of $L_{UP}/T_{SOI}$ is at least 0.35.

24 Claims, 13 Drawing Sheets

THIN FILM TRANSISTOR AND PREPARATION THEREOF

This application is a continuation of U.S. application Ser. No. 07/845,360 filed Mar. 5, 1992, now abandoned, which is a continuation of U.S. application Ser. No. 07/559,327, filed Jul. 30, 1990, now abandoned.

BACKGROUND OF THE INVENTION

1. Field of the Invention

This invention relates to a semiconductor device to be used for an electronic circuit device, particularly to a thin film transistor having an SOI structure and a method for preparing the same.

2. Related Background Art

Thin film transistors have been recently attracting attention as semiconductor devices which constitute three-dimensional integrated circuits, contact type image sensors and devices for planar displays. Particularly in silicon thin film transistors, higher performances are effected by making crystallinity approximate to that of single crystal. Quite recently studies are going to be done in order to obtain the film thickness with a very high mobility of carrier by the mechanism inherent in an ultra-thin film (0.1 μm or less). However, in such studies, only a specific characteristic is of interest, and how other transistor characteristics change accompanied therewith has not been clarified or even grasped.

The present inventors have pursued the study concerning the overall electrical characteristics of thin film transistors having SOI structures, and consequently found that the drain dielectric strength when the gate voltage is 0 volt (during OFF) is abruptly deteriorated, if the film thickness of the semiconductor film become thinner than a certain film thickness. The present inventors have made many experimentations repeatedly, and consequently found that the phenomenon as described below occurred. That is, while the avalanche breakdown at the drain edge which determines the drain dielectric strength is generated in the vicinity of the gate interface generally in the case of a thick film, it is generated in the vicinity of the interface with the subbing insulating substrate at a certain film thickness or less. More specifically, for example, in an SOI (Semiconductor on Insulator) type insulated gate field effect transistor constituted by formation of a thin film semiconductor layer, a gate insulating film and a gate electrode on a thick insulating substrate, it has been said in the prior art that the avalanche breakdown occurs initially in the vicinity of the gate interface because the maximum field is concentrated at the vicinity of the gate interface, and its tendency does not depend of the film thickness of the semiconductor layer. In contrast, the present inventors, on the basis of a new thought to consider the presence of an interface fixed charge (Qss) between the subbing insulating substrate and the semiconductor layer in the real SOI structure, first performed simulation. Then, as expected, although the electrical field was stronger on the gate interface side as compared with the vicinity of the subbing interface at a certain film thickness or less, the actual avalanche breakdown was found to take place in the vicinity of the subbing interface. Although a more detailed theoretical mechanism is now in the course of clarification, probably the avalanche breakdown depends not only on the electrical field, but also the number of carriers, and when Qss is accounted for at the gate and the vicinity of the subbing interface, this may be the cost of a greater influence of the subbing interface on the number of carriers.

To make the technique as described above easier to understand, first the SOI type field effect transistor of the prior art is described.

FIG. 1A shows a cross-sectional structure of the SOI type thin film field effect transistor of the prior art (A type). Also, FIG. 1B is a schematic sectional view showing the SOI type thin film field effect transistor to which an off-set structure is applied (B type). The distance of the off-set is prepared so as to be equal to the distance of the off-set in an embodiment of the present invention as described below. Here, 1 is an insulating substrate, 2 semiconductor layer, 3 a gate insulating layer, 4 gate electrode.

In the A type of the prior art type, dielectric strength is, for example, as low as 6 volts. On the other hand, when off-set as in the B type obtained by improvement thereof, even if another structure is the same, due to the influence of the electrical field near the gate interface being relaxed, the electrical field at the subbing interface is indirectly relaxed. As the result, the dielectric strength is more or less improved. However, its value is, for example, as low as 10 volts, and no practical value can be obtained. In a thin film field effect transistor, because it is a thin film, the region with the strongest electrical field depends on the position of junction between the drain and the channel on the gate insulating film side, and this region is in the vicinity of the vertical line from the junction position to the subbing insulating substrate. Hence, because the region with the strongest electrical field and the junction interface where avalanche is susceptible to occur overlap each other in the impurity profile as in the prior art, avalanche breakdown is very likely to occur. Even when off-set may be employed, the electrical field relaxation at the subbing interface is not so great.

The points as described in detail above are described in more detail by comparison with the prior art example.

For example, for relaxation of the electrical field in the vicinity of the drain edge, the method of Lightly-Doped-Drain (LDD) which forms a region with thin concentration in the vicinity of drain has been known in the art.

FIG. 2 is a cross-sectional view of the MOSFET of the thin film of the prior art created by use of the LDD method as mentioned above. In FIG. 2, 301 is a subbing insulating substrate, 302 a semiconductor layer, 303 a gate insulating film, 304 a polycrystalline silicon film, 309 a source, 310 a drain, 306 a low impurity concentration region source, and by forming the low impurity concentration region drain 307 in the vicinity of the drain 310, the high field in the vicinity of the drain 310 is attempted to be relaxed. In the same Figure, 308 is NSG, 311 PSG and 314, 315 are electrodes.

However, even in such an ultra-thin MOSFET, simultaneously with a deterioration of drain dielectric strength by the high field in the vicinity of the above-mentioned drain, if the film thickness of the semiconductor layer 302 is thinner than a certain film thickness, the drain dielectric strength when the gate voltage is 0 volt (during OFF) abruptly deteriorates as compared with the case of a thick film.

On the other hand, in the structure as shown in FIG. 2, in which the junction interface between the low impurity concentration region 307 of the drain and the high impurity concentration region 310 of the drain used in the prior art is located below the gate insulating film 303, the avalanche breakdown at the drain edge which determines the drain dielectric strength occurs generally in the vicinity of the polycrystalline silicon film 304 in the case of a thick film, while it occurs in the interface vicinity with the subbing insulating substrate 301 with a certain film thickness or less as described above.

As described in the above, in the prior art SOI type transistor, a problem concerned with withstand voltage remains.

SUMMARY OF THE INVENTION

An object of the present invention is to provide an improved thin film transistor of low cost and high performance.

Another object of the present invention is to provide an improved transistor of SOI structure based on the new finding as described above, which is a thin film transistor improved in deterioration of drain dielectric strength during OFF while maintaining high characteristics of high mobility and low parasitic capacitance by making the film thinner.

For accomplishing the above objects, the thin film transistor of the present invention, by forming a sectional structure of the Junction interface between the low impurity concentration region the channel and the high impurity concentration region the drain which is more remote from the gate end from the gate insulating film toward the other insulating film (subbing insulating film), has a structure which slips the drain junction which is susceptible to avalanche with the strongest region of the electrical field in the vicinity of the subbing insulating film and at the same time can relax the electrical field near the drain junction.

Still another object of the present invention is to realize an improved thin film transistor in a transistor of SOI structure as one of semiconductor devices, which is improved in deterioration of drain dielectric strength during OFF as mentioned above, namely the drain dielectric strength deterioration by avalanche breakdown occurring at the interface between the semiconductor layer and the subbing insulating substrate, while maintaining good characteristics such as high mobility and low parasitic capacity by making the transistor thinner and finer.

Still further object of the present invention is to provide a thin film transistor by forming the boundary surface of the drain obliquely, for example, a drain region which is more remote from the gate toward the subbing insulating layer can be prepared, whereby electrical field concentration occurring at the interface of the drain layer can be relaxed to improve dielectric strength of breakdown by avalanche.

The above described object is achieved by a thin film transistor having a semiconductor layer region sandwiched between first insulating layer region and second insulating layer region, and a control electrode provided on said semiconductor layer region via said second insulating layer region, wherein said semiconductor layer region has a channel region and plurality of main electrode regions of impurity concentration higher than that of said channel region, and an interface between at least one of said plurality of main electrode regions and said channel region has a sectional structure which is more remote from said control electrode said in the direction from said second insulating layer region said toward said first insulating layer region. And, the above thin film transistor can be obtained by producing method comprising obliquely implanting impurity into the interface between said semiconductor layer region and said second insulating layer region, or producing method comprising a step of producing said main electrode region after formation of an oblique surface corresponding to said interface by anisotropic etching.

Further, the above described transistor provides excellent performance when it is mounted within variety of apparatuses described as follows.

The apparatus include an electronic circuit apparatus comprising the above thin film transistor and a photoelectric conversion element integrally formed together on a common substrate, another electronic circuit apparatus comprising the above thin film transistor and a liquid crystal cell driven by the transistor, an information processing apparatus comprising: an electronic circuit device wherein a thin film transistor and a photoelectric conversion element are provided integrally on a common substrate; means for maintaining an original at a reading position; and light source for illuminating the original, and an information processing apparatus comprising: an electronic circuit device having a thin film transistor and a liquid crystal cell driven by said thin film transistor; and means for outputting signal to be inputted into said electronic circuit device.

DETAILED DESCRIPTION OF THE PREFERRED EMBODIMENTS

Figure 1A:
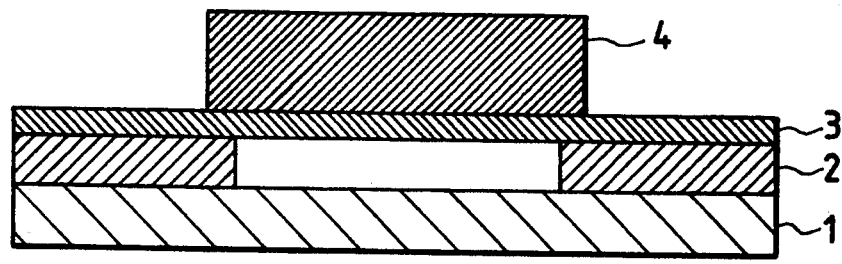
FIGS. 1A and 1B are schematic cross-sectional views showing a field effect transistor of the prior art.

Referring now to the drawings, the embodiments according to the present invention are described, but the present invention is not limited to the following embodiments, but may have another constitution which can accomplish the objects of the present invention.

In a thin film field effect transistor, having the SOI structure provided with a semiconductor layer region on a substrate, that is, a first insulating layer region, with its surface being insulating as the support, and also having a high impurity concentration forming a main electrode region used as the drain reaching the subbing insulating film, there exists the problem inherent in thin film SOI that a current will pass through the whole film when the film thickness of the semiconductor layer becomes about 2 times or less the maximum depletion layer width. Along with this, the avalanche breakdown occurring elsewhere at the drain edge becomes a problem. Particularly, avalanche in the vicinity of the interface with the subbing insulating film is generated also during an OFF state of the gate voltage to bring about lowering in drain dielectric strength.

Figure 3:
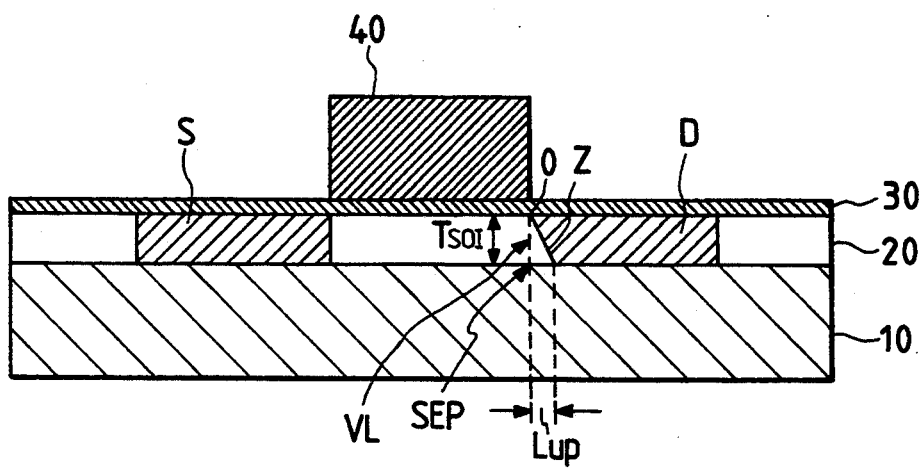
FIG. 3 is a schematic cross-sectional view of the SOI type thin film field effect transistor according to a first preferred embodiment of the present invention.

A preferred embodiment of the present invention which can solve the technical problem as described above is adapted to have a structure in which the junction interface between the drain region and the region forming the channel (channel-drain junction surface) is more remote from the gate constituting the control electrode than it is near a side of the gate insulating film as a second insulating layer region toward the subbing insulating film. At this time, as shown in FIG. 3 the channel-drain Junction interface is formed so that ratio $L_{UP}/T_{SOI}$ may be 0.35 or more when a position of the channel-drain junction interface immediately beneath the gate insulating film is original point (0), the layer thickness of the semiconductor layer is made $T_{SOI}$ and the displacement of the channel-drain junction surface in the direction crossing vertically the layer thickness direction of the semiconductor layer $L_{UP}$. By the structure, the most preferable result can be obtained because the drain dielectric strength is markedly improved. The shape of the junction surface may have a constitution which is gradually remote from the gate, and is not particularly limited, but for avoiding unnecessary electrical field concentration, a smooth shape such as single flat plane as shown in FIG. 3, etc. is desirable. Such structure cannot be accomplished by using merely the MOS process known in the art, but as described later, must be positively formed such as by oblique implantation of ions from an angle of 10 and some degrees. The film thickness of the semiconductor layer which is the high impurity concentration region is extremely thin, for example, 1000 Å.

To the best knowledges of the present inventors, because the semiconductor region is a thin film of thin film SOI structure, the region with the strongest electrical field within the device is not along the junction interface between the drain and the channel, but at the position determined by the junction of the drain and the channel on the gate insulating film side, namely in the vicinity along the vertical line from the junction position to a position SEP in FIG. 3 of the subbing insulating substrate. Hence, by making a structure of the preferred embodiment of the present invention, (1) the drain junction interface susceptible to avalanche with the maximum field strength region is slipped, and (2) the field gradient becomes corresponding to such slippage, whereby the maximum field strength can be lowered. As the result, in the case that the same structure for other portions and the channel-drain junction are used, the drain dielectric strength during OFF of the MOS type field effect transistor which was about 6 to 8 volts in the prior art can be improved to about 20 volts which had been unconceivable up to date.

As the first insulating layer region in the present invention, an insulating substrate itself of sapphire, alumina, glass, resin, etc., or alternatively, the insulating region formed in the semiconductor substrate or an insulating layer of silicon oxide, silicon nitride, etc. provided on a semiconductor substrate or an electroconductive substrate may be employed, and further an insulating layer of silicon oxide, silicon nitride, etc. as the protective layer provided on the substrate having elements with various functions formed thereon may be applicable.

As the second insulating layer region, silicon oxide, silicon nitride, silicon oxynitride and etc. are used.

As the structures of the gate electrode and the source-drain electrode, the upper gate stagger type, the lower gate stagger type, the upper gate coplanar type, the lower gate coplanar type, etc. may be employed.

As the semiconductor layer, single crystalline layer, and, non-single crystalline layer such as polycrystalline layer, microcrystalline layer comprising silicon as the matrix may be employed, but among them, single crystalline layer or polycrystalline layer having high carrier mobility is preferred.

First embodiment

FIG. 3 is a schematic cross-sectional view showing FET of SOI structure according to an embodiment of the present invention. 10 is a sapphire substrate having an insulating surface, 20 is a semiconductor layer comprising a single crystalline silicon with a layer thickness, of 2000 Å formed on the sapphire substrate 10, 30 is a silicon oxide film with a layer thickness of 500 Å as provided an insulating layer on the semiconductor layer 20, and 40 is a gate electrode comprising a polycrystalline silicon arranged on the silicon oxide film.

Figure 5:
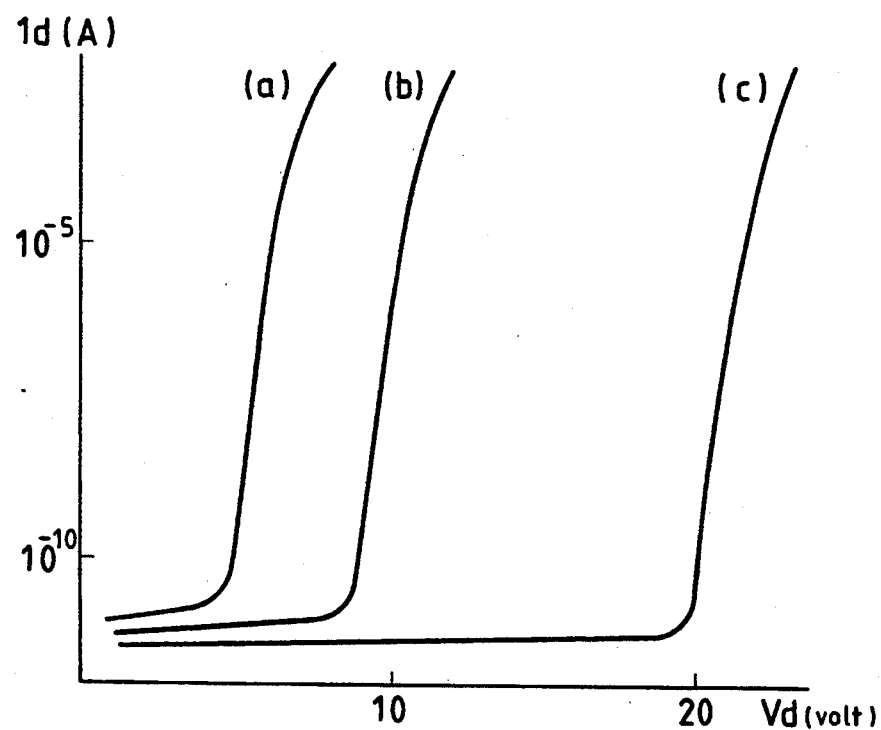
FIG. 5 is a graph showing the drain dielectric strength characteristics during OFF of the SOI type thin film field effect transistors of the prior art example and the second embodiment.

FIG. 5 is a graph showing results comparisons between the transistors according to present invention and the prior art. Curve (a) in FIG. 5 shows the characteristics of the prior art type transistor, curve (b) shows the characteristics of the MOS type field effect transistor having an off-set structure, and curve (c) shows the OFF characteristic of the MOS type field effect transistor having the structure of the present invention. It is shown that the present invention has not only changed the prior art type to the off-set structure, but also attained a great effect through the action different therefrom.

Figure 1B:
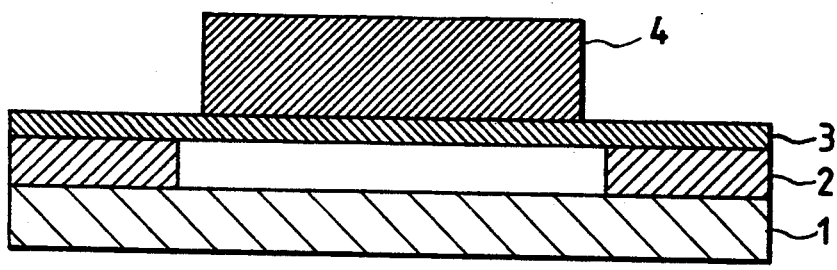

In FIG. 5, (a) shows the dielectric strength according to the embodiment shown in FIG. 1A, and (b) shows the dielectric strength according to the embodiment shown in FIG. 1B, (c) shows the dielectric strength according to the present embodiment. As shown in FIG. 5, (a) is about 6 volts, (b) is about 10 volts, and a dielectric strength of about 21 volts was obtained in this embodiment.

Second embodiment

Referring now to FIG. 4 and FIG. 5, a second embodiment of the present invention is described. The structure is shown in FIG. 4D. In the present embodiment, a drain interface S has an offset structure. A source interface is parallel to the drain interface and is closer to the side of the gate electrode than the drain interface. Next with regard to a production process, the embodiment is more clearly explained. For formation of the substrate having an insulating surface and the semiconductor on the substrate, oxygen was injected onto the P-type single crystalline silicon substrate 100 having a plane direction of (100) with an impurity concentration of $1 \times 10^{16}/cm^2$ as shown by the arrowhead AA at an acceleration voltage of 150 key, a total dose of $2.14 \times 10^{18}/cm^2$ and a substrate temperature of 600° C. Then, annealing is applied in $N_2$ gas at 1300° C. for 3 hours to form a P-type SIMOX substrate with a plane direction of (100) having a semiconductor layer 120 with a film thickness of 1000 Å. 101 the lower semiconductor layer and 110 the first insulating layer (see FIG. 4B). A gate oxide film 130 having a thickness of 500 Å is formed on the SOI substrate by the thermal oxidation method. A polycrystalline film was formed by LP-CVD thereon and $p^{31}$ was ion injected into the polycrystalline silicon, followed by formation of a N-type gate polysilicon electrode with a thickness of 4000 Å by patterning. Here, the gate length was made 2 μm and the gate width 10 μm. Next, for formation of a high impurity concentration region as the source-drain region, as shown in FIG. 3, $P^{31}$ (phosphorus) was ion injected at an acceleration voltage of 60 key from the direction in parallel to the source-drain direction (the direction in which current flows) having an implantation angle of 43° ($\theta_1$ in FIG. 4C). Subsequently a PSG film 150 was deposited to 6000 Å as the interlayer insulating film, followed by application of the heat treatment at 900° C. for 15 minutes for activation of $P^{31}$ (phosphorus). In the present embodiment, the implantation angle $\theta_1$ refers to an angle formed with the normal line direction of the gate insulating film 140 as shown in FIG. 4C. As the result, a sectional structure with the junction interface S between the low impurity concentration region 122 as the channel region and the high impurity concentration region 121 as the drain region being slanted by 43° relative to the subbing insulating film 110 was obtained. Then, aluminum used as the wiring was vapor deposited and patterned to form a drain electrode wiring 161, a source electrode wiring 162 and a gate electrode wiring 163. By deposition of a PSG film 170 as the protective film, a thin film field effect transistor having the SOI structure shown in FIG. 4D was prepared. Here, the constitution of a part of 110 was omitted. (example)

Figure 4A:
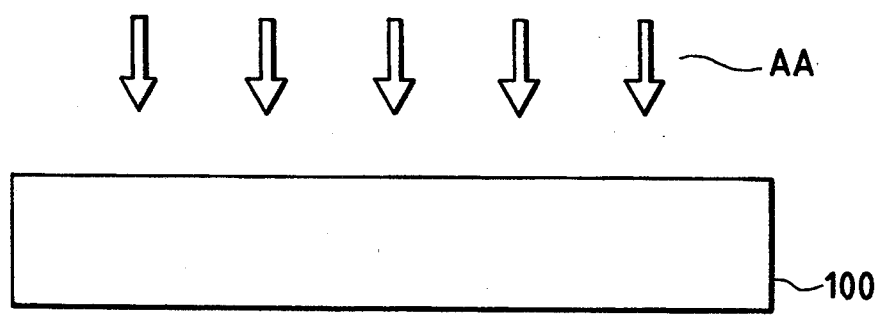
FIGS. 4A to 4D are schematic cross-sectional views of the SOI type thin film field effect transistor according to a second preferred embodiment.
Figure 4B:
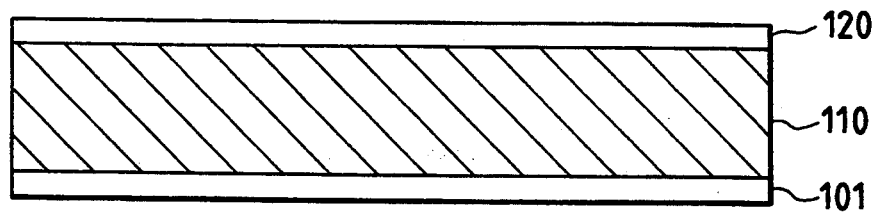
Figure 4C:
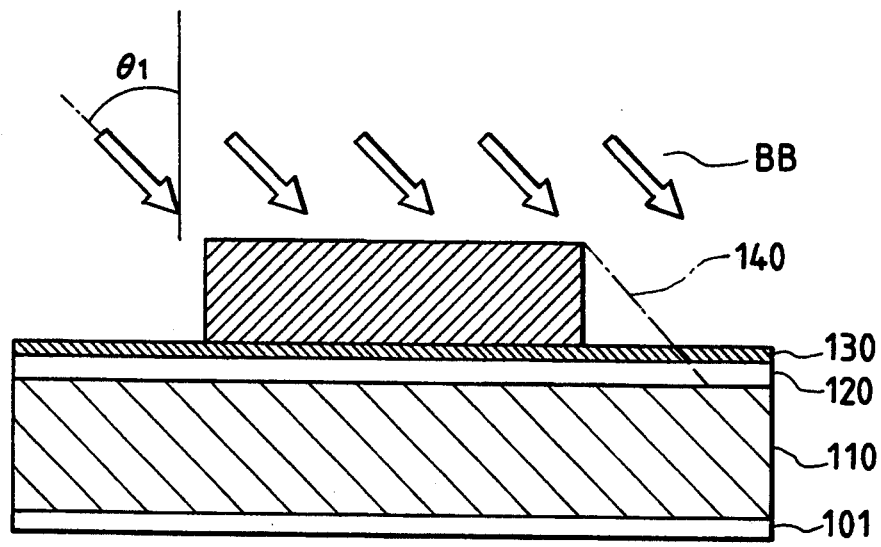
Figure 4D:
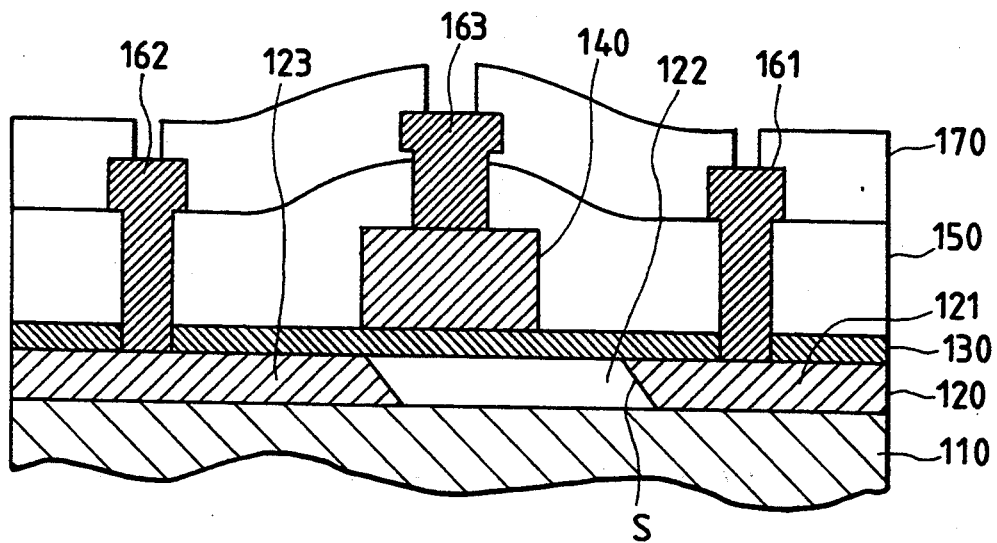

By the above described producing process, plurality of the transistors as shown in FIG. 4D are produced and evaluated. When the dielectric strength during OFF was evaluated with the one off-set (121) as the drain by use of the field effect transistor thus prepared, a value of 21 volt worth while practical application was obtained.

Formation of the source-drain region by oblique implantation of ions as described above has been practiced in bulk silicon process. Its object is channeling prevention or formation of off-set structure. However, oblique implantation of ions of the prior art has been applied on a device with a spread semiconductor without presence of a subbing insulating film. The present invention, to cope with the problem inherent in the thin film SOI type field effect transistor with the high impurity concentration region reaching the subbing insulating film, has improved the drain dielectric strength during an OFF state through the action different from the prior art by utilizing the field distribution of the thin film SOI structure. In the following, description is made as compared with the prior art.

In this embodiment, by making the profile of impurities a structure as shown in FIG. 4D by oblique implantation of ions, (1) the junction interface between the drain and the channel susceptible to avalanche with the region with the strongest field is slipped, (2) and also the potential gradient became gentle corresponding to the slippage to lower the maximum field strength, whereby the drain dielectric strength during OFF was dramatically improved by about 15 volt from the A type of the prior art and about 11 volt from the B type. Also, as to ON characteristics, electrical field was relaxed in all the regions of the drain edge to improve the kinking phenomenon.

Third embodiment

Referring now to FIG. 6 to FIG. 9, a third embodiment of the present invention is described.

Figure 7:
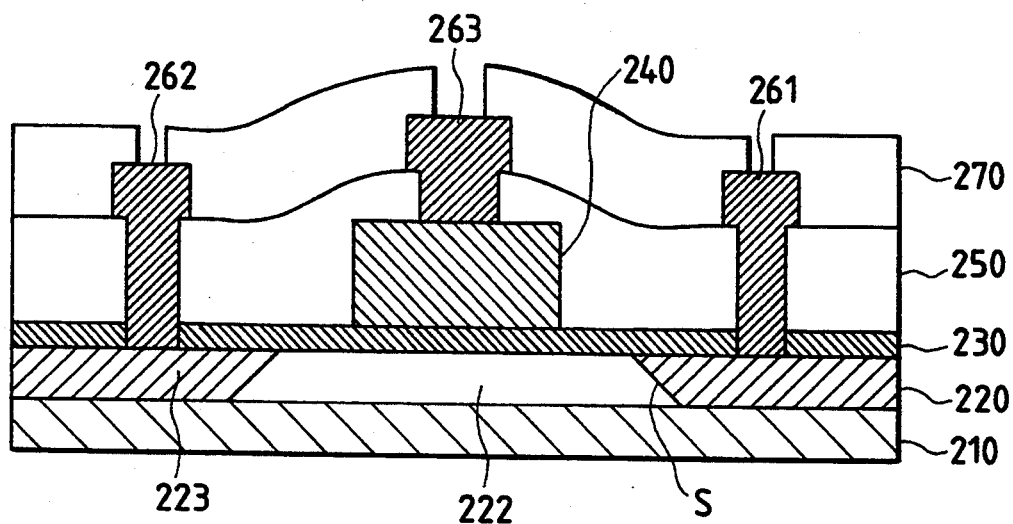
FIG. 7 is a schematic cross-sectional view of the SOI type thin field effect transistor according to the third embodiment.

FIG. 7 shows a cross-sectional structure of the transistor according to the present embodiment. The source boundary also has the offset structure like the drain boundary, and is more remote from the gate electrode side in the direction toward underlayed interface. (example)

Next, regarding to the production process, the present embodiment is described in detail.

An SOI substrate having a film thickness of the silicon single crystal 220 (SOS) on the sapphire substrate 210 of 2000 Å and an impurity concentration of $2 \times 10^{16}/cm^3$ was prepared, and a gate oxide film with a thickness of 800 Å was formed by use of the thermal oxidation method. After a polycrystalline silicon was deposited on the oxide film, $P^{31}$ was ion injected and a N-type gate polysilicon electrode 240 with a thickness of 4000 Å was formed by patterning. Here, the gate length was made 2 μm, and the gate width 10 μm.

Figure 6:
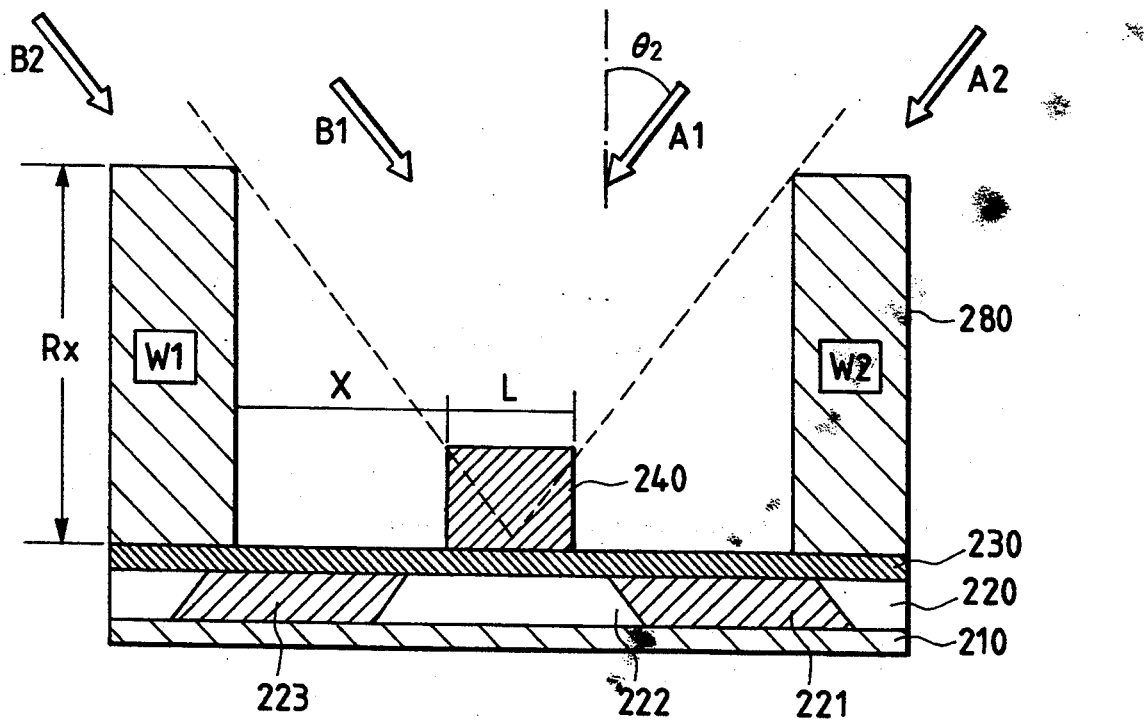
FIG. 6 is a schematic cross-sectional view showing the preparation method of the SOI type thin film field effect transistor according to a third embodiment.

Next, as shown in. FIG. 6, after a resist film 280 with a film thickness (Rx in the drawing) of 2.3 μm was formed as the mask film for impurity diffusion for formation of the source-drain region, $P^{31}$ was ion injected while rotating the substrate at an acceleration voltage of 60 key from the direction with an implantation of angle $\theta_2$ of 32°. However at this time, preparation was made so that the thickness Rx of the resist, the length X of the source-drain region between the gate and the mask and the ion injection angle $\theta_2$ satisfied the relationship of:

$$X \leq R_x \cdot \tan\theta_2 \leq X + L (L \text{ is gate length}).$$

When thus prepared $R_x=2.3$ μm, $X=3$ μm and $L=2$ μm.

Then, as the interlayer insulating film, a PSG film 250 was deposited to 6000 Å, followed by application of heat treatment at 900° C. for 15 minutes for activation of phosphorus. As the result, a sectional structure with the junction interface S between the low impurity concentration region of channel 222 and the high impurity concentration region of drain 221 slanted about 30° relative to the subbing insulating film could be obtained. Then, by vapor deposition of aluminum which is wiring, and deposition of PSG as the protective film, a drain electrode wiring 261, a source electrode wiring 22, a gate electrode wiring 263 and a protective layer 270 were formed. Thus, a thin film field effect transistor having the SOI structure shown in FIG. 7 was prepared.

Figure 8A:
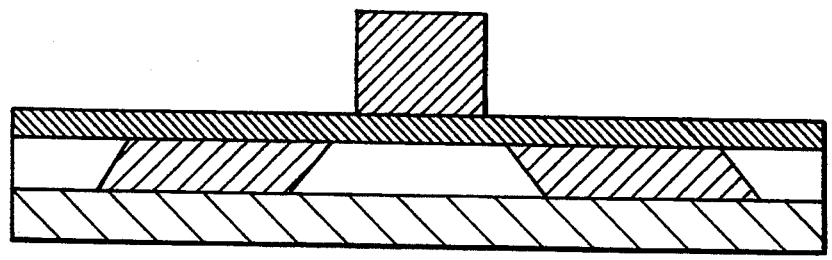
FIGS. 8A and 8B are schematic illustrations showing the impurity profile of the SOI type thin film field effect transistor according to the prior art example and the third embodiment.
Figure 8B:
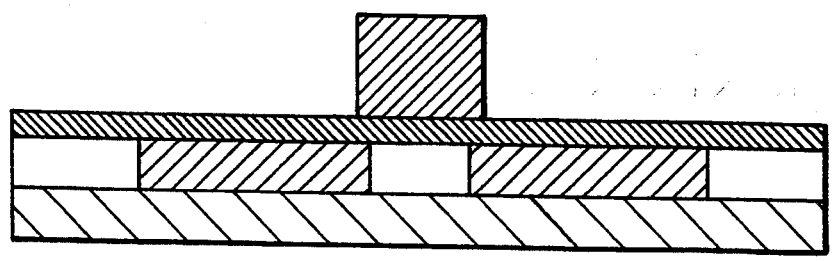

For elucidating the function of the resists W1, W2 as the mask film in FIG. 6, FIG. 8A shows a schematic illustration of the impurity profile in the sectional direction of the present embodiment, and FIG. 8B, as a reference, an impurity profile sectional view in the sectional direct/on when similar ion injection was effected in the case of low W1, W2 similarly as in conventional source-drain mask (namely $R_x \cdot \tan\theta < X$). When, W1, W2 are low, the junction interface has no slant, and the drain region will be spread to below the gate. In this embodiment, since W1, W2 of the drain mask satisfied $X \leq R_x \cdot \tan\theta \leq X+L$, the ions A1, A2 from the A direction in FIG. 6 will not reach the region 221 (for example, drain) (will not be injected thereinto) because W2 forms a shadow in the drain region. And, only the implanting ion A1 reaches the region 223 (for example, source) to be injected thereinto. As the result, a SOI type thin film field effect transistor having a symmetrical off-set structure can be produced. (example)

Figure 9:
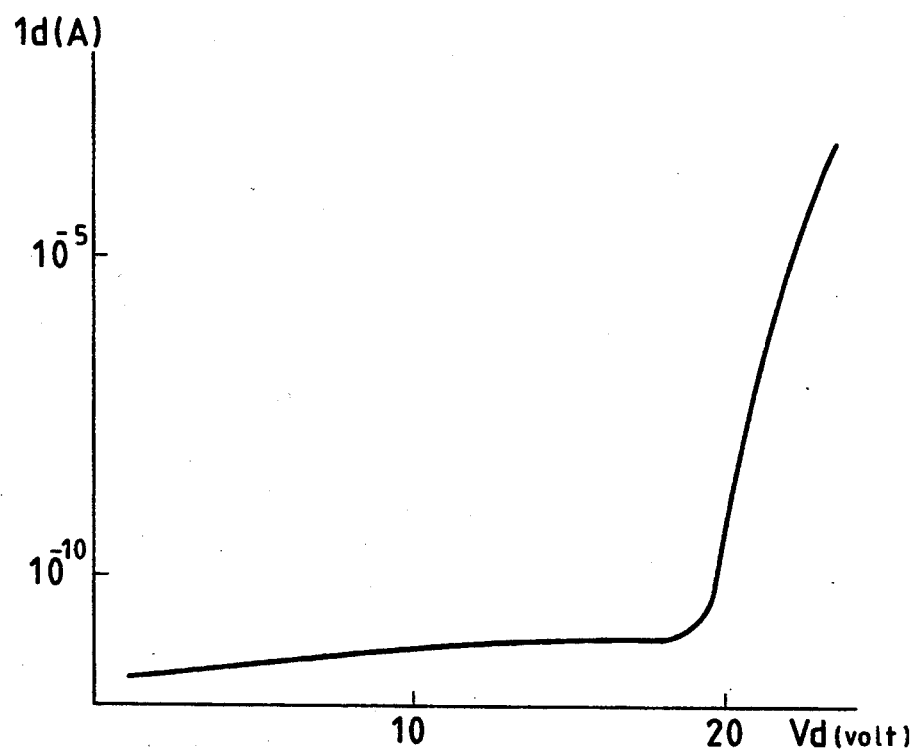
FIG. 9 is a graph showing the drain dielectric strength characteristics during OFF of the SOI type thin film field effect transistor in the third embodiment.

A transistor with a junction interface between the drain and the channel produced by above described method is approximately 30 according to the above described production method. And, dielectric strength characteristic during OFF of the transistor thus measured. A result of the measurement is shown in FIG. 9. Dielectric strength became a practical value of about 20 volt. Also, in ON characteristics, improvement of the kinking phenomenon was effected as compared with the prior art example in which reduction occurred similarly as in the mechanism of drain dielectric strength improvement during OFF in the whole region of the junction interface. Further, due to symmetrical structure, the lay-out is not restricted at all during circuit design, whereby its general purpose applicability could be expanded. (example)

Figure 10:
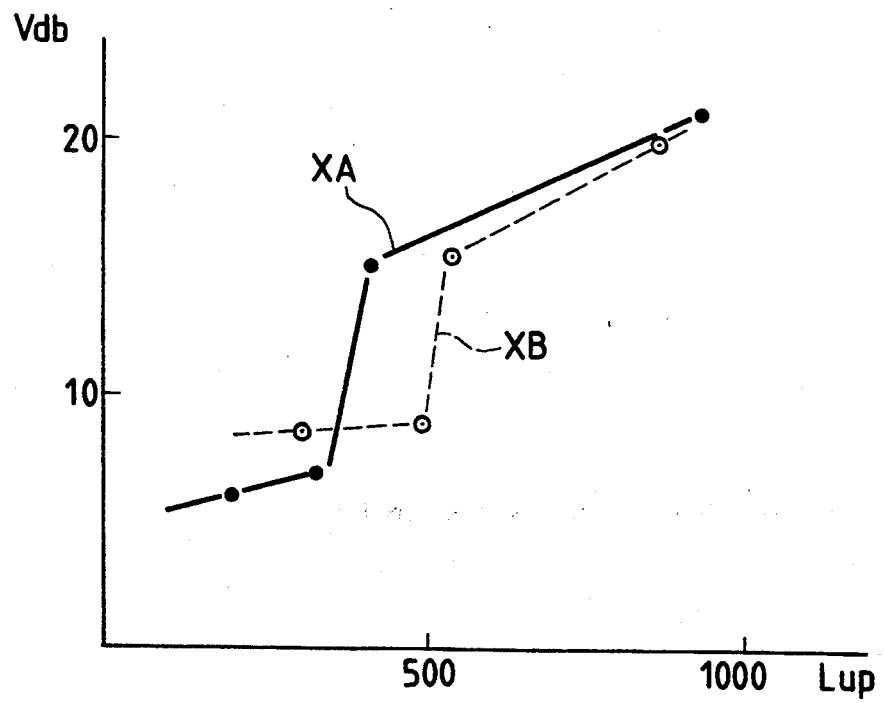
FIG. 10 is a graph showing the relationship between the drain dielectric strength and the displacement amount of the position of the channel-drain junction interface.

Similarly as in the above second embodiment, MOS type field effect transistors with $L_{UP}$ of 200 Å, 330 Å and 410 Å, respectively, were prepared by changing the implantation angles in ion implantation to 11°, 18° and 22°, respectively. As the result the drain dielectric strengths $V_{db}$ of the respective samples during OFF were found to be 7 V, 8 V and 15 V. FIG. 10 shows the manner of such change in XA. When $L_{UP}$ became 350 Å or higher, the drain dielectric strength was markedly improved.

Also, in the case when the semiconductor layer is made to have a thickness of 1500 Å or more, as the result of similar measurement of drain dielectric strengths, the dielectric strength was found to be abruptly improved when $L_{UP}$ became 530 Å or more.

As described above, by making $L_{UP}/T_{SOI}$ 0.35 or more, the characteristics can be further improved.

In the foregoing respective Examples, by making a structure with the junction interface between the drain region and the channel region in the vicinity of the subbing interface being more apart from the gate edge than the drain junction interface in the vicinity of the gate insulating film, particularly the drain junction interface susceptible to avalanche with the region of the strongest field at the subbing interface is slipped, and also the electrical field is relaxed at the junction interface, whereby there is the effect to increase the dielectric strength during OFF by making occurrence of avalanche difficult.

Also, by practicing the structure of the present invention by oblique implantation of ions, the off-set structure can be easily prepared, and during ON, there are the effects of reducing hot carriers, and improving the kinking phenomenon.

Fourth embodiment

Figure 2:
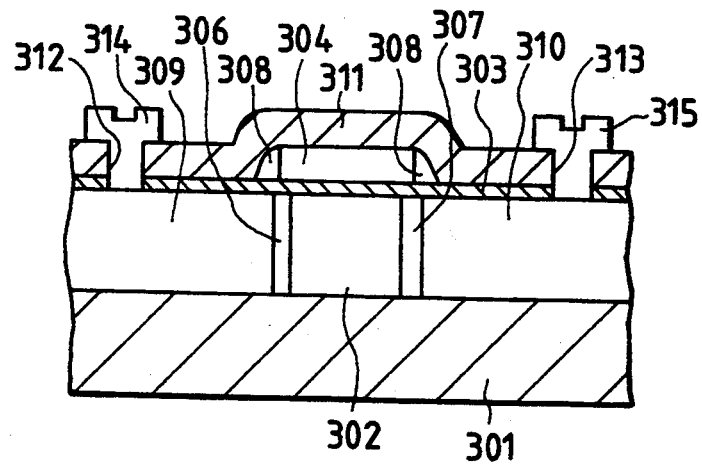
FIG. 2 is a schematic illustration of the steps showing an example of the preparation method of SOI type transistor according to the preparation method of the present invention.

FIGS. 11A to 11D are schematic sectional views showing the preparation method of a semiconductor device according to an embodiment of the present invention. The structural members with the same constitution as those shown in the prior art example in FIG. 2 are attached with the same symbols.

The present embodiment is most characterized in that an interface between the channel region and the low impurity concentration drain region, and an interface between the low impurity concentration drain region, and the high impurity drain region are both inclined.

Figure 11A:
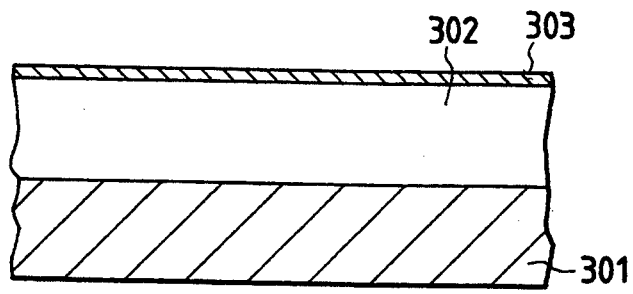
FIGS. 11A to 11D are schematic illustrations of steps showing an example of the preparation method of the SOI type transistor of the present invention.

First, as shown in FIG. 11A, a semiconductor layer 302 of 700 Å was formed on a thick insulating substrate 301 and then a gate insulating film 303 of 300 Å was formed.

Figure 11B:
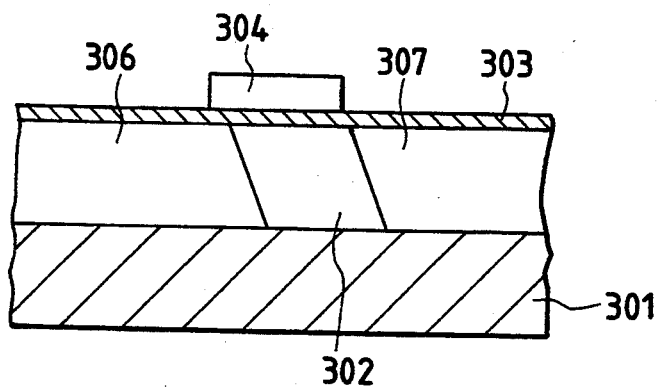

Next, after deposition of a polycrystalline silicon film with a thickness of 4000 Å as shown in FIG. 11B, phosphorus is diffused to effect etching of the polycrystalline silicon film by use of the photolithographic technique, to form a gate electrode 304.

Further, $5 \times 10^{12}$ of phosphorus (atoms/cm$^2$) as in FIG. 4C are implanted as the impurity obliquely into the semiconductor layer by use of ion implantation, followed by annealing, to form a low concentration source 306 and a low concentration drain 307.

Figure 11C:
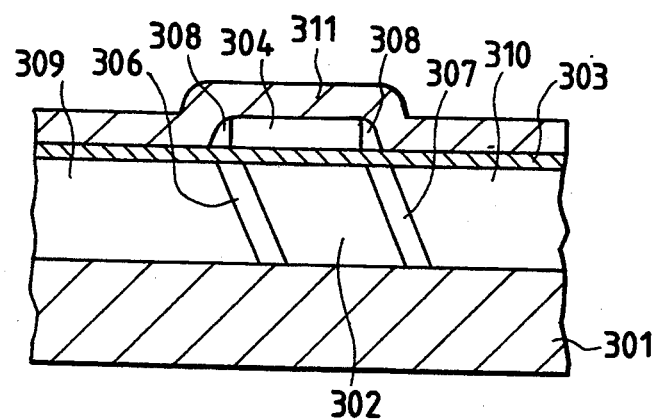

Next, as shown in FIG. 11C, a NSG film 308 is deposited to 3000 Å, anisotropic etching effected by RIE to have the NSG film 308 remain only at the side wall of the polycrystalline film gate electrode 304, and then $1 \times 10^{15}$ (atoms/cm$^2$) of phosphorus are implanted obliquely into the semiconductor layer 302 by use of ion implantation to deposit a PSG film 311, followed by annealing, to form a source 309 and a drain 310.

Figure 11D:
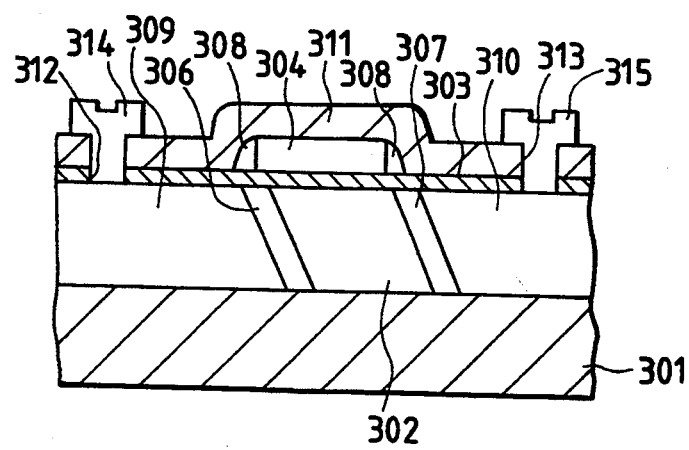

Next, as shown in. FIG. 11D, the PSG film 11 and the oxide film (insulating film) 303 are provided with openings 312 and 313, and electrodes 314 and 315 are formed to form the SOI type transistor of the present embodiment having trapezoidal sectional area.

Fifth embodiment

Figure 12:
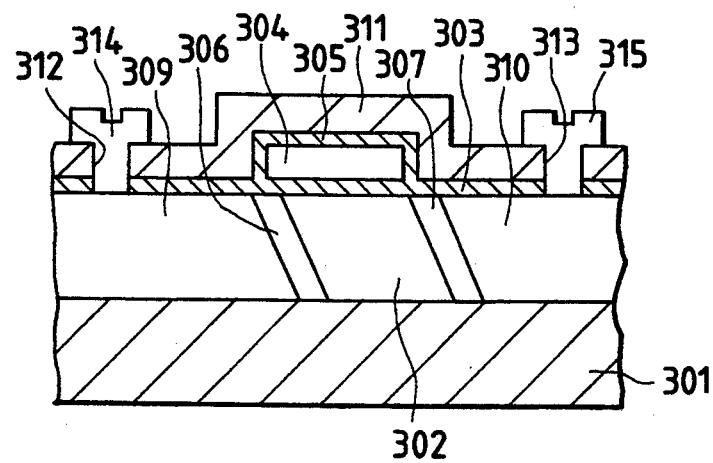
FIG. 12 is a schematic illustration of the steps showing another example of the preparation method of the SOI type transistor of the present invention.

FIG. 12 is another embodiment of the preparation method of the SOI transistor of the present invention.

In this embodiment, in the same manner as in the method shown in FIG. 11A and 11B, after formation of a gate insulating film 303, a polycrystalline silicon film 304 doped with phosphorus and a source 306 and a drain 307 of low concentrations, oxidation is carried out to form an oxide film. Then, remaining the oxide film over the gate, according to the same method as in FIG. 11C, phosphorus is injected as the impurity into the source 309 and the drain 310 to form a PSG film 311, followed by annealing. And, by forming the electrodes according to the same method as in FIG. 11D, the SOI type transistor of the present embodiment is formed.

Sixth Embodiment

FIGS. 13A to 13F are sectional views showing still another embodiment of the preparation steps of the semiconductor device of the present invention.

Figure 13A:
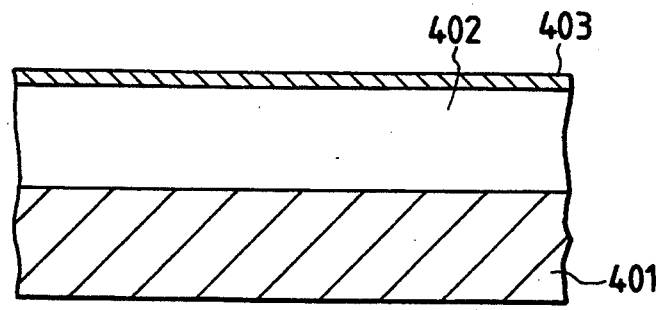
FIGS. 13A to 13F are schematic illustrations of steps showing still another example of the preparation method of the semiconductor device of the present invention.

First, as shown in FIG. 13A, a semiconductor layer 402 having a plane direction of (100) of 700 Å is formed on the subbing insulating substrate 401, and then a gate insulating film 403 of 300 Å is formed thereon.

Figure 13B:
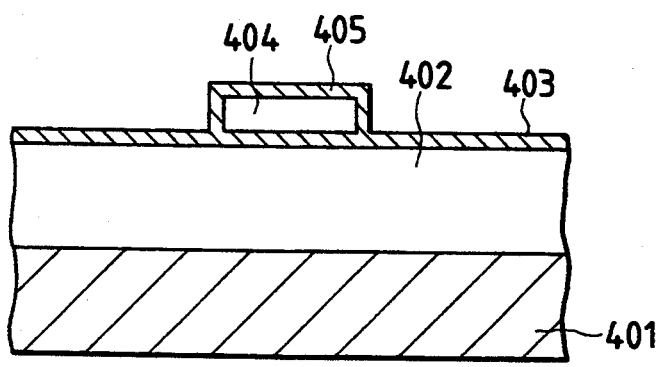

Next, as shown in FIG. 13B, a polycrystalline silicon gate electrode 404 is deposited, and phosphorus is diffused to etch the polycrystalline silicon 4 by use of the photolithographic technique, followed by oxidation to form an oxide film 405 which is thicker than the insulating film 403 on the polycrystalline silicon gate electrode 404.

Figure 13C:
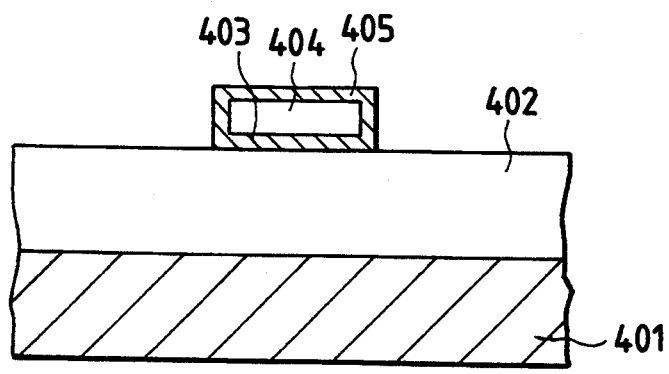

Next, the gate insulating film 403 except on the region touching with the polycrystalline film 404 is removed as shown in FIG. 13C.

Figure 13D:
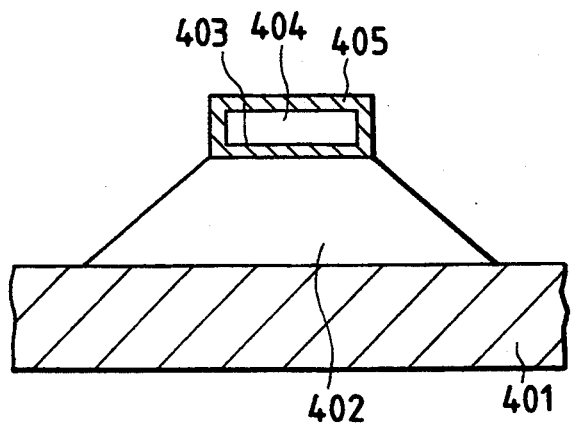

Next, as shown in FIG. 13D, with the oxide film 404 as the etching mask, anisotropic etching of the semiconductor layer 402 is effected with the use of a mixture (e.g. $KOH:IPA:H_2O=2:7:1$) of KOH, IPA (isopropyl alcohol) and water to form the slanted surface (e.g. (111) surface) of the semiconductor layer 402.

Figure 13E:
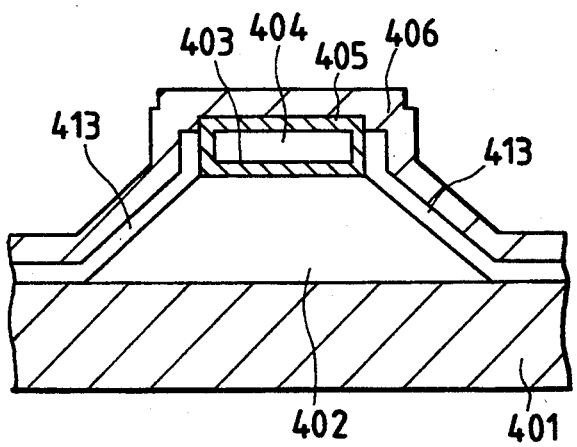

Next, as shown in FIG. 13E, a polycrystalline silicon film is deposited, and the polycrystalline silicon film on the polycrystalline silicon gate electrode 404 is removed by etching by use of photolithographic technique, and then $5 \times 10^{15}$ (atoms/cm$^2$) of phosphorus are injected as the impurity by use of ion implantation to form polysilicon film 413, followed further by deposition of a PSG film 406.

Figure 13F:
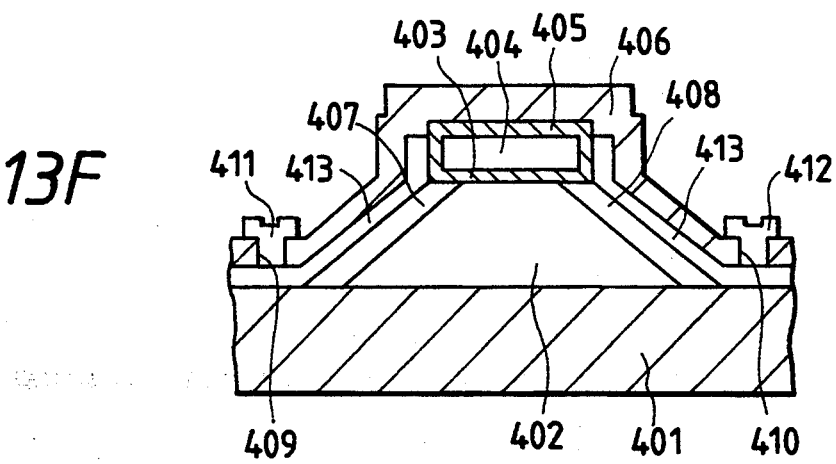

Next, when heat treatment is applied as shown in FIG. 13F, phosphorus is diffused from the polycrystalline film 413 into the semiconductor layer 402, whereby a source 407 and a drain 408 are formed. Next, contact holes 409 and 410 are opened on the PSG film 406, and electrodes 411 and 412 are formed, whereby the semiconductor device of the present invention can be obtained.

Seventh Embodiment

FIGS. 14A to 14D are still another embodiment showing the preparation steps according to the preparation method of the semiconductor device of the present invention.

Figure 14A:
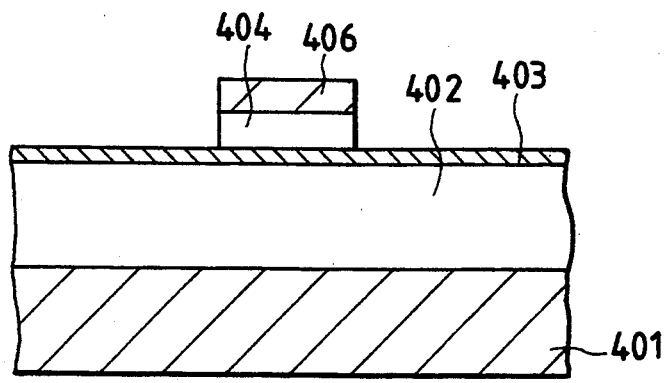
FIGS. 14A to 14D are schematic illustrations of steps showing still another example of the preparation method of the semiconductor device of the present invention.

As shown in FIG. 14A, after formation of the semiconductor layer 402 and the gate insulating film 403 on the insulating substrate 401 according to the same method as shown in FIG. 13A, deposition of the polysilicon film 404, phosphorus diffusion and deposition of the PSG film 406 are performed, and the PSG film 406 and the polycrystalline silicon film 404 are etched.

Figure 14B:
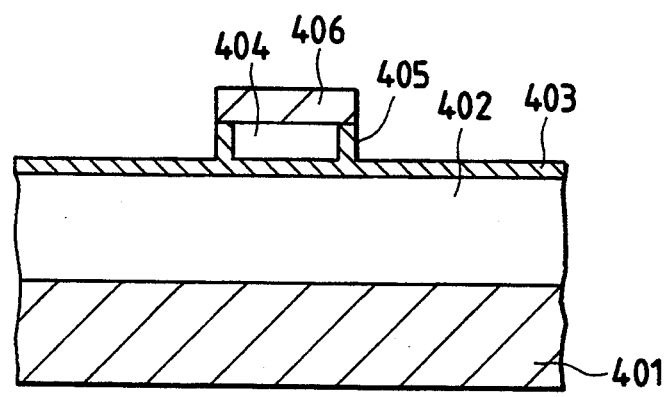

Next, as shown in FIG. 14B, oxidation is carried out, whereby an oxide film 405 grows at a side of the polycrystalline silicon film 404.

Figure 14C:
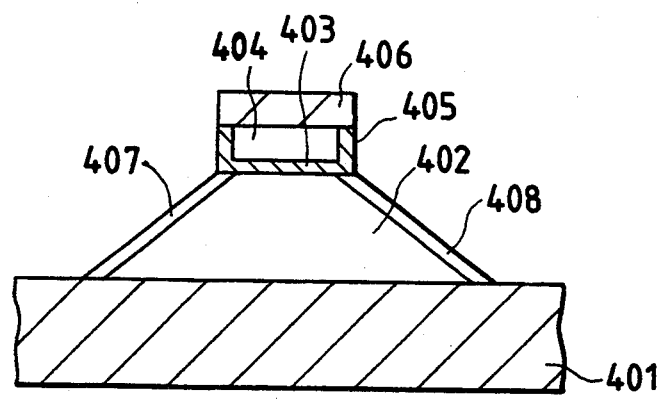

Next, as shown in FIG. 14C, after removal of the gate insulating film 403 except on the region covered with the polycrystalline silicon film 404, the semiconductor layer 402 is anisotropically etched, $1 \times 10^{15}$ (atoms/cm$^2$) of phosphorus are injected as the impurity by use of ion implantation, followed further by heat treatment, to form a source 407 and a drain 408, so that inclined source-channel junction and inclined drain-channel junction are formed.

Figure 14D:
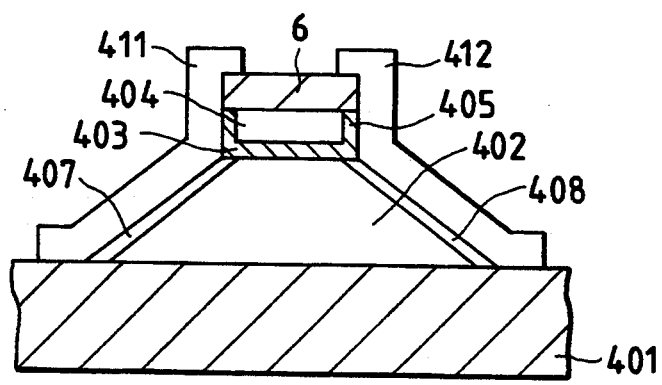

Next, electrodes 411 and 412 are formed as shown in FIG. 14D, to form the semiconductor device of the present embodiment.

Eighth Embodiment

FIGS. 15A to 15F are diagrams of the steps showing still another embodiment of the preparation method of the semiconductor device of the present invention.

Figure 15A:
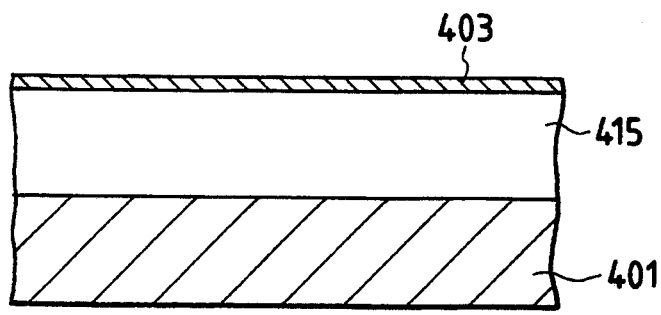
FIGS. 15A to 15F are schematic illustrations of steps showing still another example of the preparation method of the semiconductor device of the present invention.
Figure 15B:
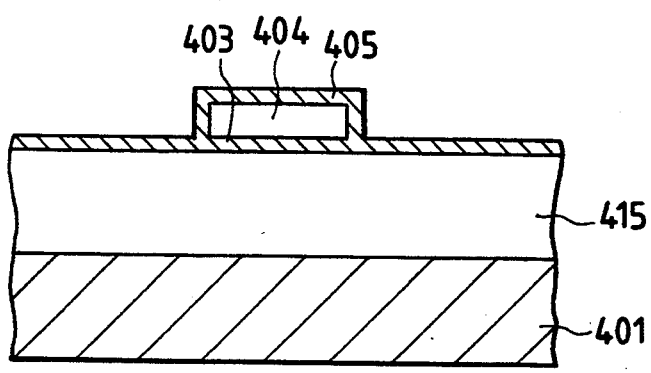
Figure 15C:
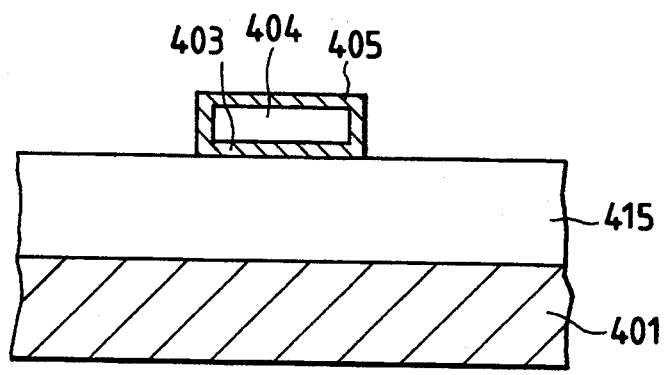
Figure 15D:
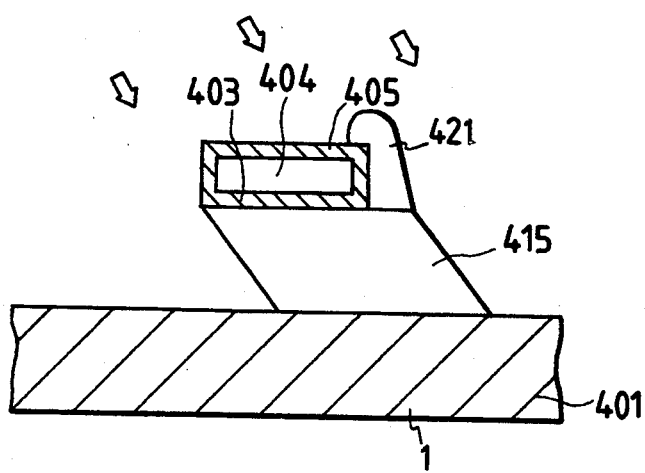

First, according to the same method as in FIGS. 13A to 13C, after formation of the gate insulting film 403, the polycrystalline silicon 404 and the oxide film 405 on the surface of the semiconductor layer 415, as shown in FIG. 15D, the semiconductor 41 is anisotropically etched by reactive ion etching (R.I.E.) with the oxide film 415 as the resist mask using $CCl_2F_2$, $N_2$ and $O_2$.

Figure 15E:
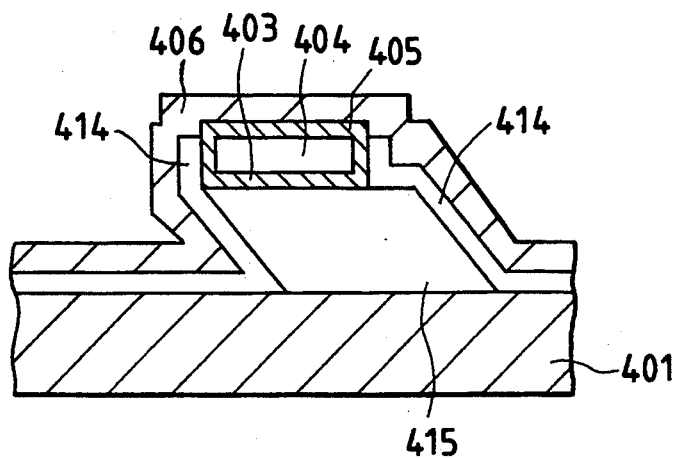

Next, as shown in FIG. 15E, after formation of a polycrystalline film 414 containing $2 \times 10^{20}$ of phosphorus (atoms/cm$^3$) to 5000 Å, the polycrystalline silicon film 414 containing phosphorus on the oxide film 405 is removed by use of photolithographic technique, and then a PSG film 406 is deposited.

Figure 15F:
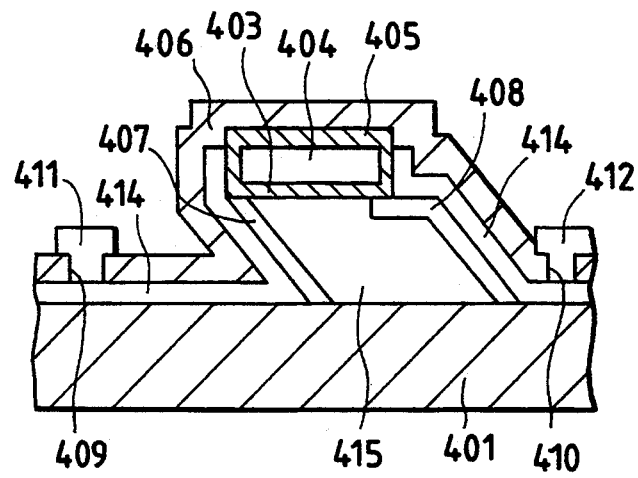

Next, as shown in FIG. 15F, heat treatment is applied, whereby phosphorus is diffused from the polycrystalline silicon film 414 into the semiconductor layer 415 to form a source 407 and a drain 408.

Next, after contact holes 409 and 410 are opened on the PSG film, electrodes 411 and 412 are formed to give the semiconductor device of the present embodiment.

According to the preparation method of the semiconductor device of the embodiment, by etching the semiconductor layer 402 or 415 in the drain forming region thinner as more remote from the gate to form a semiconductor layer forming a slanted surface relative to the subbing insulating substrate 401 and a drain layer 408 along said surface, the angle formed between the subbing insulating substrate 1 and the drain layer 408 can be made slanted.

In the present embodiments, by doing so, there can be obtained the effect that the field concentration occurring at the interface between the subbing insulating substrate 401 and the drain layer 408 is relaxed, and for this reason, there can be obtained the effect that breakdown dielectric strength of the drain by avalanche occurring at the interface is improved.

Above described transistor is applicable to electronic circuit device such as a three dimensioned integrated circuit, a contact type image sensor, a liquid crystal display device, and similar devices, to improve significantly the performance of them. Further, such electronic circuit device can be mounted within information processing apparatuses, such as a copier, a facsimile machine, an image reader, a word processor, a liquid crystal television set.

Figure 16A:
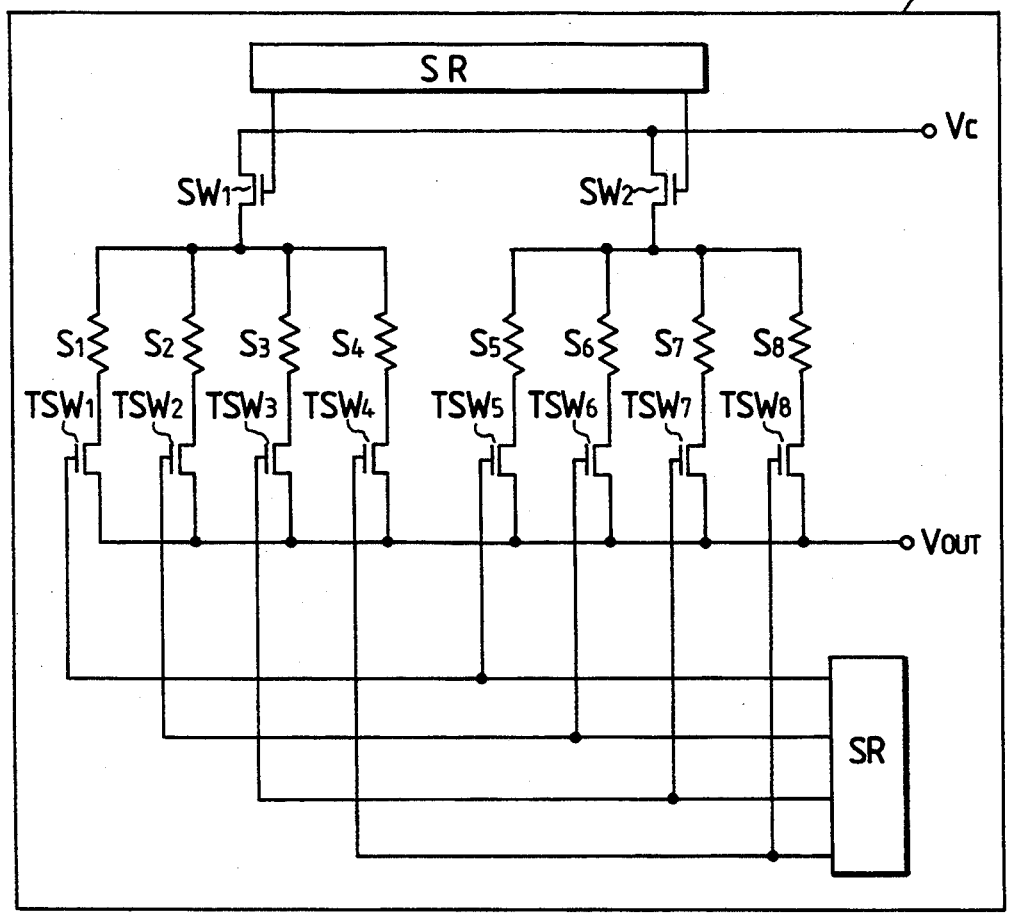
FIGS. 16A to 16C show electric circuit diagrams of an electronic circuit device having a thin film transistor according to the present invention, and a schematic illustration an information processing apparatus provided with the device.

FIG. 16A shows a circuit diagram of a contact type image sensor. The thin film transistor according to the present invention is formed as switch means for signal reading integrally together with a photoelectric conversion element on a common substrate.

In FIG. 16A, a simple example comprising 4 segments ×2 blocks is shown for the purpose of easy understanding. Respective photo-receiving elements $S_1$-$S_8$ are connected per a block commonly through block selection TFT switches $SW_1$, $SW_2$ to a reference voltage source VC. Another electrodes of respective photoreceiving elements $S_1$-$S_8$ connected to segment selection TFT switches $TSW_1$ to $TSW_8$. Respective Gates of TFT switches $TSW_1$-$TSW_8$ are connected commonly interconnected among corresponding segments in each block to constitute gate common lines, and scanned by shift-register SR. Respective sources are commonly interconnected and outputted via common output line $V_{out}$.

Figure 16B:
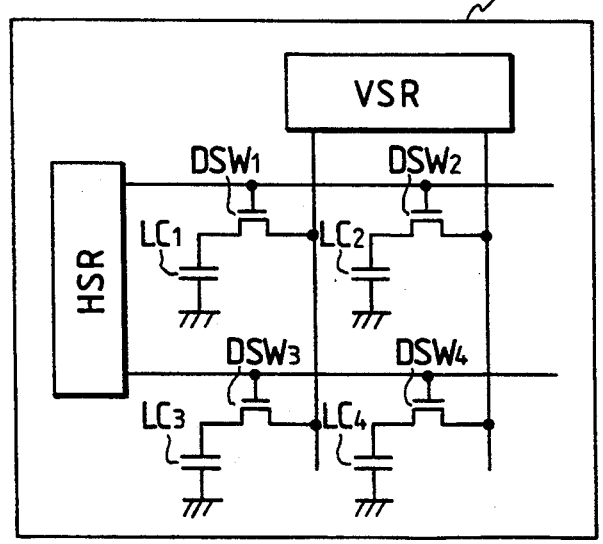
Figure 16C:
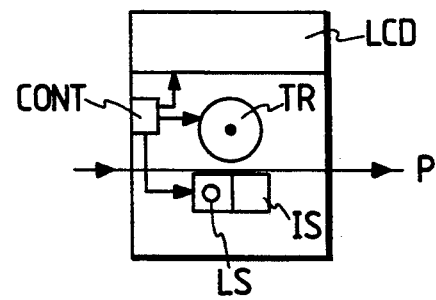

Such image sensor IS constitutes an information processing apparatus, together with a light source LS for illuminating an original, conveying roller TR, i.e., a maintaining means, for maintaining an original P at a reading position, and controlling means CONT for controlling the light source LS, the roller TR, and the image sensor IS (FIG. 16C). FIG. 16B shows a circuit diagram of the liquid crystal display device.. The thin film transistor of the present invention is for use in switches $DSW_1$-$DSW_4$ driving liquid crystal cells $LC_1$-$LC_4$ constituting respective pixels. Gates and sources thereof are connected in a matrix configuration, and driven by a vertical line selection shift register USR and a horizontal line selection shift register HSR. Such liquid display device is connected to the information processing apparatus as shown in FIG. 16C. By means of the control means, an output signal read by the sensor is supplied to the liquid crystal device to display an image. Thus, a monitor of the original reading can be achieved.

We claim:

1. An information processing apparatus for reading an original at a reading position, said information processing apparatus comprising:
   an electronic circuit device having a thin film transistor comprising:
   a first insulating layer region,
   a semiconductor layer region disposed on said first insulating layer region comprising a channel region and a plurality of main electrode regions having an impurity concentration of said channel region,
   a second insulating layer region disposed on said semiconductor layer region, and
   a control electrode disposed on a first area of said second insulating layer region,
   wherein an interface defined between at least one of said main electrode regions and said channel region through a thickness of said semiconductor layer region becomes increasingly remote from a side of the control electrode in the direction from said second insulating layer region toward said first insulating layer region, wherein with a position of aid interface immediately beneath said insulating layer region as an original point, when a layer thickness of said interface is defined as $T_{SOI}$ and a maximum distance of said semiconductor layer region in the direction normal to a layer thickness direction is defined as $L_{UP}$ the value of $L_{UP}/T_{SOI}$ is at least 0.35, wherein said interface is arranged under a second area of said second insulating layer region and wherein the second area is different from the first area;
   a photoelectric conversion element, wherein said electronic circuit and said photoelectric conversion element are provided integrally on a common substrate;
   means for maintaining an original at a reading position; and
   a light source for illuminating the original.

2. An information processing apparatus for reading an original at a reading position, said information processing apparatus comprising:
   an electronic circuit device having a thin film transistor comprising:
   a first insulating layer region,
   a semiconductor layer region disposed on said first insulating layer region comprising a channel region and a plurality of main electrode regions having an impurity concentration higher than an impurity concentration of said channel region,
   a second insulating layer region disposed on said semiconductor layer region, and
   a control electrode disposed on a first area of said second insulating layer region,
   wherein an interface defined between at least one of said main electrode regions and said channel region through a thickness of said semiconductor layer region becomes increasingly remote from a side of the control electrode in the direction from said second insulating layer region toward said first insulating layer region, wherein said interface comprises a substantially linear shape, wherein aid interface is arranged under a second area of said second insulating layer region, and wherein the second area is different than the first area;
   a photoelectric conversion element, wherein said electronic circuit and said photoelectric conversion element are provided integrally on a common substrate;
   means for maintaining art original at a reading position; and
   a light source for illuminating the original.

3. A thin film transistor comprising:
   a first insulating layer region;
   a semiconductor layer region disposed on said first insulating layer region comprising a channel region and a plurality of main electrode regions having an impurity concentration higher than an impurity concentration of said channel region;
   a second insulating layer region disposed on said semiconductor layer region; and
   a control electrode disposed on a first area of said second insulating layer region,
   wherein an interface defined between at least one of said main electrode regions and said channel region through a thickness of said semiconductor layer region becomes increasingly remote from a side of the control electrode in the direction from said second insulating layer region toward said first insulating layer region, wherein with a position of said interface immediately beneath said second insulating layer region as an original point, when a layer thickness of said semiconductor layer region is defined as $T_{SOI}$ and a maximum distance of said interface in the direction normal to a layer thickness direction is defined as $L_{UP}$, the value of $L_{UP}/T_{SOI}$, is at least 0.35, wherein said interface is arranged under a second area of said second insulating layer region, wherein the second area is different from the first area, and
   wherein said at least one of said plurality of main electrode regions includes a first semiconductor region and a second semiconductor region having an impurity concentration higher than that of said first semiconductor region, and an interface between said first and second semiconductor regions through the thickness of said semiconductor layer region becomes increasingly remote from said side of said control electrode in the direction from said second insulating layer region toward said first insulating layer region.

4. A thin film transistor comprising:
a first insulating layer region;
a semiconductor layer region disposed on said first insulating layer region comprising a channel region and a plurality of main electrode regions having an impurity concentration higher than an impurity concentration of said channel region;
a second insulating layer region disposed on said semiconductor layer region; and
a control electrode disposed on a first area of said second insulating layer region,
wherein an interface defined between at least one of said main electrode regions and said channel region through a thickness of said semiconductor layer region becomes increasingly remote from a side of the control electrode in the direction from said second insulating layer region toward said first insulating layer region, wherein with a position of said interface immediately beneath said second insulating layer region as an original point, when a layer thickness of said semiconductor layer region is defined as $T_{SOI}$ and a maximum distance of said interface in the direction normal to a layer thickness direction is defined as $L_{UP}$, the value of $L_{UP}/T_{SOI}$ is at least 0.35, wherein said interface is arranged under a second area of said second insulating layer region, wherein the second area is different from the first area, and
wherein said semiconductor layer region is arranged so that an interface between another of said plurality of main electrode regions and said channel region through the thickness of said semiconductor layer region becomes increasingly closer to said side of said control electrode in the direction from said second insulating layer region toward said first insulating layer region.

5. A thin film transistor comprising:
a first insulating layer region;
a semiconductor layer region disposed on said first insulating layer region comprising a channel region and a plurality of main electrode regions having an impurity concentration higher than an impurity concentration of said channel region;
a second insulating layer region disposed on said semiconductor layer region; and
a control electrode disposed on a first area of said second insulating layer region,
wherein an interface defined between at least one of said main electrode regions and said channel region through a thickness of said semiconductor layer region becomes increasingly remote from a side of the control electrode in the direction from said second insulating layer region toward said first insulating layer region, wherein with a position of said interface immediately beneath said second insulating layer region as an original point, when a layer thickness of said semiconductor layer region is defined as $T_{SOI}$ and a maximum distance of said interface in the direction normal to a layer thickness direction is defined as $L_{UP}$, the value of $L_{UP}/T_{SOI}$ is at least 0.35, wherein said interface is arranged under a second area of said second insulating layer region, wherein the second area is different from the first area, and
wherein a cross-sectional area of said channel region has a rhomboid configuration.

6. A thin film transistor comprising:
a first insulating layer region;
a semiconductor layer region disposed on said first insulating layer region comprising a channel region and a plurality of main electrode regions having an impurity concentration higher than an impurity concentration of said channel region;
a second insulating layer region disposed on said semiconductor layer region; and
a control electrode disposed on a first area of said second insulating layer region,
wherein an interface defined between at least one of said main electrode regions and said channel region through a thickness of said semiconductor layer region becomes increasingly remote from a side of the control electrode in the direction from said second insulating layer region toward said first insulating layer region, wherein with a position of said interface immediately beneath said second insulating layer region as an original point, when a layer thickness of said interface is defined as $T_{SOI}$ and a maximum distance of said semiconductor layer region in the direction normal to a layer thickness direction is defined as $L_{UP}$, the value of $L_{UP}/T_{SOI}$ is at least 0.35, wherein said interface is arranged under a second area of said second insulating layer region, wherein the second area is different from the first area, and
wherein said semiconductor layer region is formed by single crystalline silicon.

7. A thin film transistor comprising:
a first insulating layer region;
a semiconductor layer region disposed on said first insulating layer region comprising a channel region and a plurality of main electrode regions having an impurity concentration higher than an impurity concentration of said channel region;
a second insulating layer region disposed on said semiconductor layer region; and
a control electrode disposed on a first area of said second insulating layer region,
wherein an interface defined between at least one of said main electrode regions and said channel region through a thickness of said semiconductor layer region becomes increasingly remote from a side of the control electrode in the direction from said second insulating layer region toward said first insulating layer region, wherein said interface comprises a substantially linear shape, wherein said interface is arranged under a second area of said second insulating layer region, wherein the second area is different than the first area, and
wherein said at least one of said plurality of main electrode regions includes a first semiconductor region and a second semiconductor region having an impurity concentration higher than that of said first semiconductor region, and an interface between said first and second semiconductor regions through the thickness of said semiconductor layer region becomes increasingly remote from said side of said control electrode in the direction from said second insulating layer region toward said first insulating layer region.

8. A thin film transistor comprising:

a first insulating layer region;
a semiconductor layer region disposed on said first insulating layer region comprising a channel region and a plurality of main electrode regions having an impurity concentration higher than an impurity concentration of said channel region;
a second insulating layer region disposed on said semiconductor layer region; and
a control electrode disposed on a first area of said second insulating layer region,
wherein an interface defined between at least one of said main electrode regions and said channel region through a thickness of said semiconductor layer region becomes increasingly remote from a side of the control electrode in the direction from said second insulating layer region toward said first insulating layer region, wherein said interface comprises a substantially linear shape, wherein said interface is arranged under a second area of said second insulating layer region, wherein the second area is different than the first area, and
wherein said at least one of said plurality of main electrode regions includes a first semiconductor region and a second semiconductor region having an impurity concentration higher than that of said first semiconductor region, and an interface between said first and second semiconductor regions through the thickness of said semiconductor layer region becomes increasingly remote from said side of said control electrode in the direction from said second insulating layer region toward said first insulating layer region,
wherein said semiconductor layer region is arranged so that an interface between another of said plurality of main electrode regions and said channel region through the thickness of said semiconductor layer region because increasingly closer to said side of said control electrode in the direction from said second insulating layer region toward said first insulating layer region.

9. A thin film transistor comprising:
a first insulating layer region;
a semiconductor layer region disposed on said first insulating layer region comprising a channel region and a plurality of main electrode regions having an impurity concentration higher than an impurity concentration of said channel region;
a second insulating layer region disposed on said semiconductor layer region; and
a control electrode disposed on a first area of said second insulating layer region,
wherein an interface defined between at least one of said main electrode regions and said channel region through a thickness of said semiconductor layer region becomes increasingly remote from a side of the control electrode in the direction from said second insulating layer region toward said first insulating layer region, wherein said interface comprises a substantially linear shape, wherein said interface is arranged under a second area of said second insulating layer region, wherein the second area is different than the first area,
wherein a cross-sectional area of said channel region has a rhomboid configuration.

10. A thin film transistor comprising:
a first insulating layer region;
a semiconductor layer region disposed on said first insulating layer region comprising a channel region and a plurality of main electrode regions having an impurity concentration higher than an impurity concentration of said channel region;
a second insulating layer region disposed on said semiconductor layer region; and
a control electrode disposed on a first area of said second insulating layer region,
wherein an interface defined between at least one of said main electrode regions and said channel region through a thickness of said semiconductor layer region becomes increasingly remote from a side of the control electrode in the direction from said second insulating layer region toward said first insulating layer region, wherein said interface comprises a substantially linear shape, wherein said interface is arranged under a second area of said second insulating layer region, wherein the second area is different than the first area,
wherein a cross-sectional area of said channel region has a rhomboid configuration.
wherein said semiconductor layer region is formed by single crystalline silicon.

11. An apparatus according to claim 2, wherein said semiconductor layer region is arranged so that an interface between another of said plurality of main electrode regions and said channel region through the thickness of said semiconductor layer region becomes increasingly remote from said side of the control electrode in the direction from said second insulating layer region toward said first insulating layer region.

12. An apparatus according to claim 2, wherein a cross-sectional area of said channel region has a trapezoid configuration.

13. An apparatus according to claim 2, wherein a cross-sectional area of said channel region has a configuration of a trapezoid having equal legs.

14. An apparatus according to claim 2, wherein said semiconductor layer region is formed by non-single crystalline silicon.

15. An apparatus comprising a transistor according to any one of claims 6–10, and a photoelectric conversion device.

16. An apparatus comprising a transistor according to any one of claims 6–10, and a liquid crystal device.

17. An apparatus according to claim 2, wherein said at least one of said plurality of main electrode regions includes a first semiconductor region and a second semiconductor region having an impurity concentration higher than that of said first semiconductor region, and an interface between said first and second semiconductor regions through the thickness of said semiconductor layer region becomes increasingly remote from said side of said control electrode in the direction from said second insulating layer region toward said first insulating layer region.

18. An apparatus according to claim 2, wherein said semiconductor layer region is arranged so that an interface between another of said plurality of main electrode regions and said channel region through the thickness of said semiconductor layer region becomes increasingly closer to said side of said control electrode in the direction from said second insulating layer region toward said first insulating layer region.

19. A thin film transistor according to any of claims 6 or 10, wherein said semiconductor layer region is arranged so that an interface between another of said plurality of main electrode regions and said channel region through the thickness of said semiconductor layer region becomes increasingly remote from said side of the control electrode in the direction from said second insulating layer region toward said first insulating layer region.

20. An apparatus according to claim 2, wherein a cross-sectional area of said channel region has a rhomboid configuration.

21. A thin film transistor according to any of claims 6 or 10, wherein a cross-sectional area of said channel region has a trapezoid configuration.

22. A thin film transistor according to any of claims 6 or 10, wherein a cross-sectional area of said channel region has a configuration of a trapezoid having equal legs.

23. An apparatus according to claim 2, wherein said semiconductor layer region is formed by single crystalline silicon.

24. A thin film transistor according to any of claims 3, 4, 5, 7, 8 or 9, wherein said semiconductor layer region is formed by non-single crystalline silicon.

* * * * *

UNITED STATES PATENT AND TRADEMARK OFFICE
CERTIFICATE OF CORRECTION

PATENT NO. : 5,410,172

DATED : April 25, 1995

INVENTOR(S) : TORU KOIZUMI, ET AL.

It is certified that error appears in the above-identified patent and that said Letters Patent is hereby corrected as shown below:

ON TITLE PAGE

In [56] References Cited, under Attorney, Agent, or Firm: "Cella Harper" should read --Cella, Harper--.

In [57] ABSTRACT, Line 11: "increasing" should read --increasingly--.

COLUMN 1

Line 35, "become" should read --is--.
Line 53, "of" should read --on--.

COLUMN 2

Line 20, "another" should read --the remaining--.

COLUMN 3

Line 27, "Junction" should read --junction--.
Line 28, "region the" should read --region of the--.
Line 29, "region the" should read --region of the--.

COLUMN 5

Line 44, "to :have" should read --to have--.
Line 51, "Junction" should read --junction--.

COLUMN 6

Line 5, "knowledges" should read --knowledge--.
Line 25, "unconceivable" should read --inconceivable--.
Line 55, "thickness," should read --thickness--.
Line 57, "as" should be deleted.

UNITED STATES PATENT AND TRADEMARK OFFICE
CERTIFICATE OF CORRECTION

PATENT NO. : 5,410,172
DATED : April 25, 1995
INVENTOR(S) : TORU KOIZUMI, ET AL.

It is certified that error appears in the above-identified patent and that said Letters Patent is hereby corrected as shown below:

COLUMN 6

Line 58, "provided" should read --provided as--.
Line 61, "results comparisons" should read --the results of comparisons--.

COLUMN 7

Line 28, "150 key," should read --150 kev,--.
Line 38, "p$^{31}$" should read --P$^{31}$--.
Line 45, "key" should read --kev--.
Line 68, "(example)" should read --¶ (example)--.

COLUMN 8

Line 6, "volt worth while" should read --volts for a--.
Line 30, "volt" should read --volts--.
Line 43, "(ex-" should be deleted and "ample)" should read --¶ (example)--.

COLUMN 9

Line 24, "direct/on" should read --direction--.
Line 37, "(example)" should read --¶ (example)--.
Line 53, "(example)" should read --¶ (example)--.

COLUMN 10

Line 52, ":semiconductor" should read --semiconductor--.

COLUMN 11

Line 1, "remaining" should read --removing--.
Line 30, "(isopropil" should read --(isopropyl--.

UNITED STATES PATENT AND TRADEMARK OFFICE
CERTIFICATE OF CORRECTION

PATENT NO. : 5,410,172
DATED : April 25, 1995
INVENTOR(S) : TORU KOIZUMI, ET AL.

It is certified that error appears in the above-identified patent and that said Letters Patent is hereby corrected as shown below:

COLUMN 12

Line 46, "the:" should read --the--.

COLUMN 13

Line 2, "Another" should read --Other--.
Line 3, "connected" should read --are connected--.
Line 53, "aid" should read --said--.

COLUMN 14

Line 24, "aid" should read --said--.
Line 32, "art" should read --an--.

Signed and Sealed this

First Day of August, 1995

Attest:

BRUCE LEHMAN

*Attesting Officer*   *Commissioner of Patents and Trademarks*